United States Patent
Yang et al.

(10) Patent No.: US 9,620,534 B2
(45) Date of Patent: Apr. 11, 2017

(54) THIN-FILM TRANSISTOR ARRAY SUBSTRATE AND ORGANIC LIGHT-EMITTING DISPLAY APPARATUS INCLUDING THE SAME

(71) Applicant: SAMSUNG DISPLAY CO., LTD., Yongin, Gyeonggi-Do (KR)

(72) Inventors: Yongho Yang, Yongin (KR); Deukjong Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/695,326

(22) Filed: Apr. 24, 2015

(65) Prior Publication Data
US 2016/0118420 A1 Apr. 28, 2016

(30) Foreign Application Priority Data
Oct. 27, 2014 (KR) .................. 10-2014-0146421

(51) Int. Cl.
*H01L 27/12* (2006.01)
*H01L 27/32* (2006.01)

(52) U.S. Cl.
CPC ........ *H01L 27/1255* (2013.01); *H01L 27/124* (2013.01)

(58) Field of Classification Search
CPC . H01L 27/1251; H01L 27/124; H01L 27/255; H01L 27/3276
USPC ............................................. 438/35; 257/71
See application file for complete search history.

(56) References Cited

U.S. PATENT DOCUMENTS

| 6,133,967 A * | 10/2000 | Moon ............... G02F 1/136213 349/39 |
| 2002/0044243 A1 | 4/2002 | Kim et al. |
| 2008/0296581 A1* | 12/2008 | Chao ................. G02F 1/136213 257/71 |
| 2010/0163881 A1 | 7/2010 | Kang et al. |
| 2010/0259469 A1* | 10/2010 | Shimizu ............ G02F 1/133707 345/87 |
| 2011/0204368 A1* | 8/2011 | Tsubuku ............. H01L 27/1225 257/59 |

(Continued)

FOREIGN PATENT DOCUMENTS

| KR | 2002-0054853 | 7/2002 |
| KR | 10-2007-0038193 A | 4/2007 |

(Continued)

*Primary Examiner* — Caridad Everhart
(74) *Attorney, Agent, or Firm* — Lee & Morse, P.C.

(57) ABSTRACT

A thin-film transistor (TFT) array substrate includes a driving TFT, a storage capacitor, a first wire, a first interlayer insulating film, a second interlayer insulating film, and a second wire. The storage capacitor has a first electrode connected to a driving gate electrode of the driving TFT and a second electrode on and insulated from the first electrode. The first wire is on a same layer as the driving gate electrode. The first interlayer insulating film covers the first electrode and the first wire. The second interlayer insulating film is on the first interlayer insulating film and includes an opening that exposes part of the first interlayer insulating film. The second wire is on the second interlayer insulating film and at least partially overlaps the first wire. The second electrode is in the opening of the second interlayer insulating film.

21 Claims, 10 Drawing Sheets

(56) References Cited

U.S. PATENT DOCUMENTS

| | | | |
|---|---|---|---|
| 2012/0300133 A1* | 11/2012 | Saitoh | G09G 3/3607 348/731 |
| 2013/0039455 A1* | 2/2013 | Horiuchi | G11C 19/184 377/54 |
| 2014/0034923 A1 | 2/2014 | Kim et al. | |

FOREIGN PATENT DOCUMENTS

| | | |
|---|---|---|
| KR | 10-2010-0076600 | 7/2010 |
| KR | 10-2013-0062498 A | 6/2013 |
| KR | 10-2014-0018623 | 2/2014 |

* cited by examiner

THIN-FILM TRANSISTOR ARRAY SUBSTRATE AND ORGANIC LIGHT-EMITTING DISPLAY APPARATUS INCLUDING THE SAME

CROSS-REFERENCE TO RELATED APPLICATION

Korean Patent Application No. 10-2014-0146421, filed on Oct. 27, 2014, and entitled, "Thin-Film Transistor Array Substrate and Organic Light-Emitting Display Apparatus Including the Same," is incorporated by reference herein in its entirety.

BACKGROUND

1. Field

One or more embodiments described herein relate to a thin-film transistor array substrate, and an organic light-emitting display apparatus including a thin-film transistor array substrate.

2. Description of the Related Art

An organic light-emitting display apparatus generates images using organic light-emitting diodes (OLEDs). Each OLED includes an organic emission layer located between a hole injection electrode and an electron injection electrode. When holes from the hole injection electrode and electrons from the electron injection electrode combine in the organic emission layer, excitons are formed. Light is emitted when the excitons change from an excited state to a ground state.

Thus, an organic light-emitting display is a self-emissive type of display apparatus, and therefore does not use a separate light source such as a backlight. An organic light-emitting display apparatus may be driven at a low voltage and is relatively thin, light-weight, and has high quality characteristics such as a wide viewing angle, high contrast, and a quick response speed.

SUMMARY

In accordance with one or more embodiments, a thin-film transistor (TFT) array substrate includes driving TFT on a substrate; a storage capacitor including a first electrode connected to a driving gate electrode of the driving TFT, and a second electrode on and insulated from the first electrode; a first wire on a same layer as the driving gate electrode; a first interlayer insulating film covering the first electrode and the first wire; a second interlayer insulating film on the first interlayer insulating film and including an opening that exposes part of the first interlayer insulating film; and a second wire on the second interlayer insulating film and at least partially overlapping the first wire, wherein the second electrode is in the opening of the second interlayer insulating film.

A thickness of the second interlayer insulating film may be greater than a thickness of the first interlayer insulating film. A thickness of the second interlayer insulating film may be about 2 to 5 times greater than a thickness of the first interlayer insulating film. A dielectric constant of the second interlayer insulating film may be lower than a dielectric constant of the first interlayer insulating film.

The first interlayer insulating film may include an inorganic material, and the second interlayer insulating film may include an organic material. The driving gate electrode and the first electrode may be integrally formed as one body on a same layer. The driving TFT may be include a driving semiconductor layer below the driving gate electrode and insulated by a first gate insulating film, wherein the driving semiconductor layer is curved. The second wire may be a driving voltage line to supply a voltage to the driving TFT and extends from the second electrode.

In accordance with one or more other embodiments, a thin-film transistor (TFT) array substrate includes a driving TFT and a switching TFT on a substrate; a storage capacitor including a first electrode connected to a driving gate electrode of the driving TFT and a second electrode on the first electrode and insulated from the first electrode; a first interlayer insulating film covering the first electrode and a switching gate electrode of the switching TFT; and a second interlayer insulating film on the first interlayer insulating film and including an opening exposing a part of the first interlayer insulating film, wherein the second electrode is in the opening of the second interlayer insulating film.

A thickness of the second interlayer insulating film may be greater than a thickness of the first interlayer insulating film. The first interlayer insulating film may include an inorganic material, and the second interlayer insulating film may include an organic material. The driving TFT and the storage capacitor may at least partially overlap each other.

The TFT array substrate may include a first wire on a same layer as the driving gate electrode, a second wire on the second interlayer insulating film and at least partially overlapping the first wire, a contact metal on the second interlayer insulating film and connected to the switching TFT, a pad region including at least one pad connected to a driver integrated circuit for driving the driving TFT and the switching TFT; and a sealing region including a sealing material between the pad region and the driving TFT, wherein the sealing region excludes the second interlayer insulating film.

In accordance with one or more other embodiments, an organic light-emitting display apparatus includes a display area including a plurality of pixels; and a non-display area around the display area, wherein each of the plurality of pixels includes: a driving thin-film transistor (TFT) on a substrate; a storage capacitor including a first electrode connected to a driving gate electrode of the driving TFT and a second electrode on the first electrode and insulated from the first electrode; a first wire on a same layer as the driving gate electrode; a first interlayer insulating film covering the first electrode and the first wire; a second interlayer insulating film on the first interlayer insulating film and including an opening exposing part of the first interlayer insulating film; and a second wire on the second interlayer insulating film and at least partially overlapping the first wire, wherein the second electrode is in the opening of the second interlayer insulating film.

A thickness of the second interlayer insulating film may be greater than a thickness of the first interlayer insulating film. The first interlayer insulating film may include an inorganic material, and the second interlayer insulating film may include an organic material. The display apparatus may include a sealing substrate facing the substrate; and a sealing material adhering the substrate and the sealing substrate, the sealing material surrounding the display area, wherein the sealing material directly contacts the first interlayer insulating film.

The display apparatus may include an organic light-emitting diode in the display area and including a pixel electrode, an intermediate layer including an organic emission layer, and a counter electrode, a spacer that maintains a substantially uniform interval between the substrate and the sealing substrate, and a pad region in the non-display area and including at least one pad connected to a driver integrated circuit for driving the pixels. Each of the pixels may include a switching transistor, and the first interlayer insulating film and the second interlayer insulating film are stacked on a gate electrode of the switching transistor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
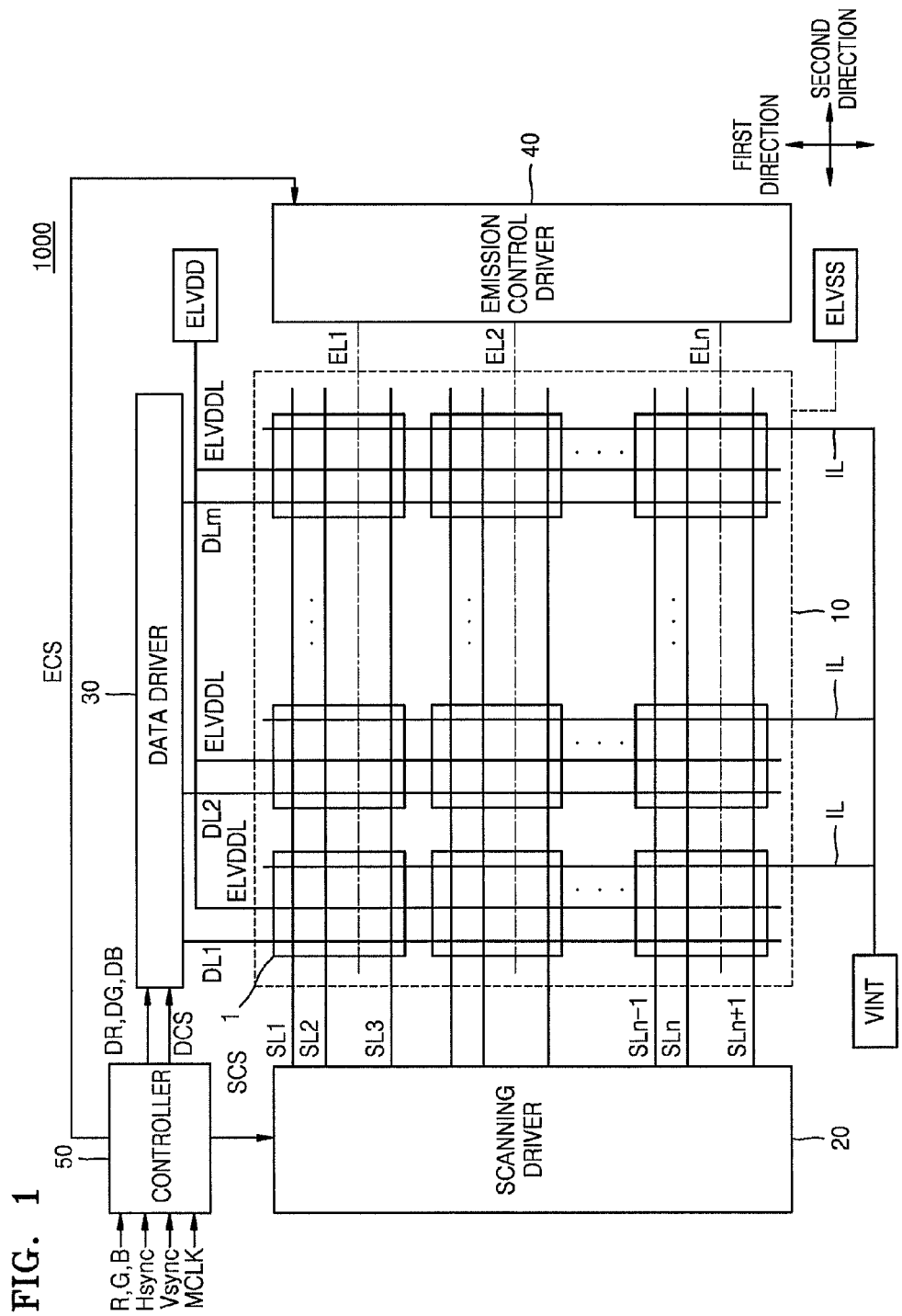
FIG. 1 illustrates an embodiment of an organic light-emitting display apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of an organic light-emitting display apparatus 1000 which includes a display unit 10 including a plurality of pixels 1, a scanning driver 20, a data driver 30, an emission control driver 40, and a controller 50.

The display unit 10 includes the plurality of pixels 1 arranged approximately in a matrix shape, and located at intersections of a plurality of scanning lines SL1 to SLn+1, a plurality of data lines DL1 to DLm, and a plurality of emission control lines EL1 to ELn. The scanning lines SL1 to SLn+1 and emission control lines EL1 to ELn extend in a second direction (e.g., a row direction), and the data lines DL1 to DLm and a driving voltage line ELVDDL extend in a first direction (e.g., a column direction). In one pixel line, the value of n in the scanning lines SL1 to SLn_1 and the value of n in the emission control lines EL1 to ELn may be different from each other.

Each pixel 1 may be connected to three of the scanning lines SL1 to SLn+1. The scanning driver 20 generates and transmits three scanning signals to each pixel 1 through the scanning lines SL1 to SLn+1. For example, the scanning driver 20 sequentially supplies a scanning signal to first scanning lines SL2 to SLn, second scanning lines SL1 to SLn−1, and third scanning lines SL3 to SLn+1.

An initialization voltage line IL may receive an initialization voltage VINT of the display unit 10 from an external power supply source VINT. Also, each pixel 1 is connected to one of the plurality of data lines DL1 to DLm connected to the display unit 10, and to one of the plurality of emission control lines EL1 to ELn connected to the display unit 10.

The data driver 30 transmits a data signal to each pixel 1 through the data lines DL1 to DLm. The data signal is supplied to the pixel 1 selected by the scanning signal, whenever the scanning signal is supplied to the first scanning lines SL2 to SLn.

The emission control driver 40 generates and transmits an emission control signal to each pixel 1 through the emission control lines EL1 to ELn. The emission control signal controls an emission time of each pixel 1. The emission control driver 40 may optionally be omitted, for example, based on an internal structure of the pixel 1.

The controller 50 changes a plurality of image signals R, G, and B received, for example, from an external source to a plurality of image data signals DR, DG, and DB, and transmits the image data signals DR, DG, and DB to the data driver 30. The controller 50 generates control signals for controlling driving of the scanning driver 20, the data driver 30, and the emission control driver 40 based on a vertical synchronization signal Vsync, a horizontal synchronization signal Hsync, and a clock signal MCLK. The controller 50 transmits the control signals to each of the scanning driver 20, the data driver 30, and the emission control driver 40. For example, the controller 50 generates and transmits a scanning driving control signal SCS for controlling the scanning driver 20, a data driving control signal DCS for controlling the data driver 30, and an emission driving control signal ECS for controlling the emission control driver 40.

Each pixel 1 receives a first power voltage ELVDD and a second power voltage ELVSS, for example, from an external source. The first power voltage ELVDD may be a first predetermined (e.g., high level) voltage, and the second power voltage ELVSS may be a second predetermined voltage, e.g., one lower than the first power voltage ELVDD or a ground or other reference voltage. The first power voltage ELVDD is supplied to each pixel 1 through the driving voltage line ELVDDL.

Each pixel 1 emits light with a luminance based on a driving current supplied to a light-emitting device. The amount of driving current is based on the data signal transmitted through a corresponding one of the data lines DL1 to DLm.

Figure 2:
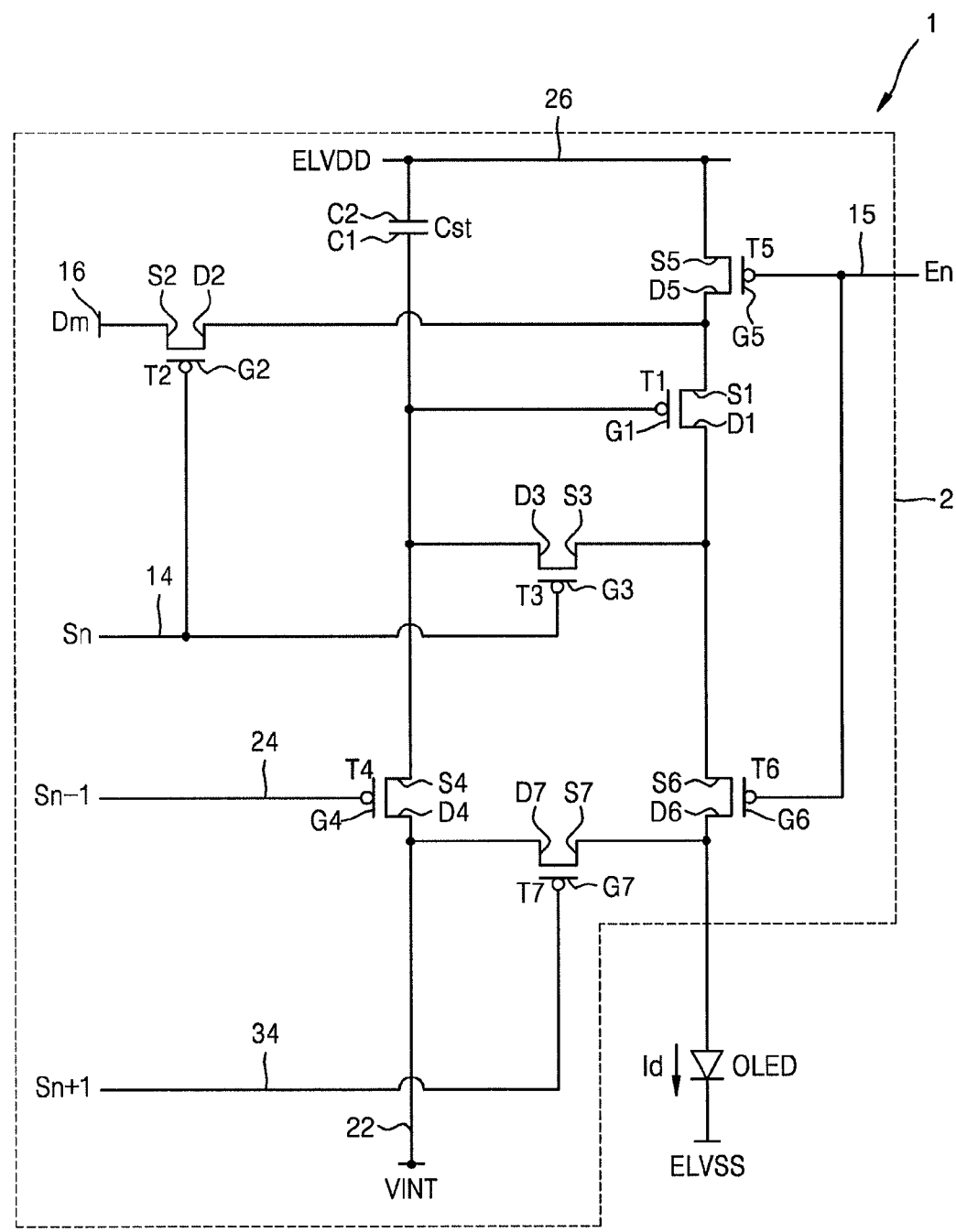
FIG. 2 illustrates an embodiment of a pixel.

FIG. 2 illustrates an embodiment of a pixel 1 of the organic light-emitting display apparatus 1000. The pixel 1 of the organic light-emitting display apparatus 1000 includes a pixel circuit 2 that includes a plurality of TFTs and at least one storage capacitor Cst. Also, the pixel 1 includes an OLED that emits light based on a driving voltage in the pixel circuit 2.

The TFTs include a driving TFT T1, a data transmission TFT T2, a compensation TFT T3, a first initialization TFT T4, a first emission control TFT T5, a second emission control TFT 6, and a second initialization TFT T7.

The pixel 1 includes the following signal lines: a first scanning line 14 through which a first scanning signal Sn is transmitted to the data transmission TFT T2 and the compensation TFT T3, a second scanning line 24 through which a second scanning signal Sn−1 is transmitted to the first initialization TFT T4, a third scanning line 34 through which a third scanning signal Sn+1 is transmitted to the second initialization TFT T7, an emission control line 15 through which an emission control signal En is transmitted to the first emission control TFT T5 and the second emission control TFT T6, a data line 16 through which a data signal Dm is transmitted, and a driving voltage line 26 through which the first power voltage ELVDD is transmitted, and an initialization voltage line 22 through which the initialization voltage VINT that initializes the driving TFT T1 is transmitted.

A driving gate electrode G1 of the driving TFT T1 is connected to a first electrode C1 of the storage capacitor Cst. A driving source electrode S1 of the driving TFT T1 is connected to the driving voltage line 26 via the first emission control TFT T5. A driving drain electrode D1 of the driving TFT T1 is electrically connected to a pixel electrode (anode electrode) of the organic light-emitting diode OLED via the second emission control TFT T6. The driving TFT T1 receives the data signal Dm according to a switching operation of the data transmission TFT T2 to supply a driving current Id to the organic light-emitting diode OLED.

A data transmission gate electrode G2 of the data transmission TFT T2 is connected to the first scanning line 14. A data transmission source electrode S2 of the data transmission TFT T2 is connected to the data line 16. A data transmission drain electrode D2 of the data transmission TFT T2 is connected to the driving source electrode S1 of the driving TFT T1 and is connected to the driving voltage line 26 via the first emission control TFT T5. The data transmission TFT T2 is turned on according to the first scanning signal Sn received through the first scanning line 14 to perform a switching operation. The data signal Dm received from the data line 16 is transmitted to the driving source electrode S1 of the driving TFT T1.

A compensation gate electrode G3 of the compensation TFT T3 is connected to the first scanning line 14. A compensation source electrode S3 of the compensation TFT T3 is connected to the driving drain electrode D1 of the driving TFT T1 and is connected to the anode electrode of the organic light-emitting diode OLED via the second emission control TFT T6. A compensation drain electrode D3 of the compensation TFT T3 is also connected to the first electrode C1 of the storage capacitor Cst, a first initialization source electrode S4 of the first initialization TFT T4, and the driving gate electrode G1 of the driving TFT T1. The compensation TFT T3 is turned on according to the first scanning signal Sn received through the first scanning line 14 to connect the driving gate electrode G1 and the driving drain electrode D1 of the driving TFT T1, thereby placing the driving TFT T1 in a diode-connected state.

A first initialization gate electrode G4 of the first initialization TFT T4 is connected to the second scanning line 24. A first initialization drain electrode D4 of the first initialization TFT T4 is connected to the initialization voltage line 22. The first initialization source electrode S4 of the first initialization TFT T4 is also connected to the first electrode C1 of the storage capacitor Cst, the compensation drain electrode D3 of the compensation TFT T3, and the driving gate electrode G1 of the driving TFT T1. The first initialization TFT T4 is turned on according to the second scanning signal Sn−1 received through the second scanning line 24, to transmit an initialization voltage VINT to the driving gate electrode G1 of the driving TFT T1. Thus, an initialization operation is performed for initializing a voltage of the driving gate electrode G1 of the driving TFT T1.

A first emission control gate electrode G5 of the first emission control TFT T5 is connected to the emission control line 15. A first emission source electrode S5 of the first emission control TFT T5 is connected to the driving voltage line 26. A first emission drain electrode D5 of the first emission control TFT T5 is connected to the driving source electrode S1 of the driving TFT T1 and the data transmission drain electrode D2 of the data transmission TFT T2.

A second emission control gate electrode G6 of the second emission control TFT T6 is connected to the emission control line 15. A second emission control source electrode S6 of the second emission control TFT T6 is connected to the driving drain electrode D1 of the driving TFT T1 and the compensation source electrode S3 of the compensation TFT T3. A second emission control drain electrode D6 of the second emission control TFT T6 is electrically connected to the anode electrode of the organic light-emitting diode OLED. The first emission control TFT T5 and the second emission control TFT T6 are simultaneously turned on according to the emission control signal En received through the emission control line 15 so that the first power voltage ELVDD is transmitted to the organic light-emitting diode OLED and the driving current Id flows through the organic light-emitting diode OLED.

A second initialization gate electrode G7 of the second initialization TFT T7 is connected to the third scanning line 34. A second initialization source electrode S7 of the second initialization TFT T7 is connected to the anode electrode of the organic light-emitting diode OLED. A second initialization drain electrode D7 of the second initialization TFT T7 is connected to the initialization voltage line 22. The second initialization TFT T7 is turned on according to the third scanning signal Sn+1 received through the third scanning line 34, thereby initializing the anode electrode of the organic light-emitting diode OLED.

A second electrode C2 of the storage capacitor Cst is connected to the driving voltage line 26. The first electrode C1 of the storage capacitor Cst is connected to the driving gate electrode G1 of the driving TFT T1, the compensation drain electrode D3 of the compensation TFT T3, and the first initialization source electrode S4 of the first initialization TFT T4.

A cathode electrode of the organic light-emitting diode OLED is connected to the second power voltage ELVSS. The organic light-emitting diode OLED receives the driving current Id from the driving TFT T1 to emit light, thereby displaying an image.

Figure 3:
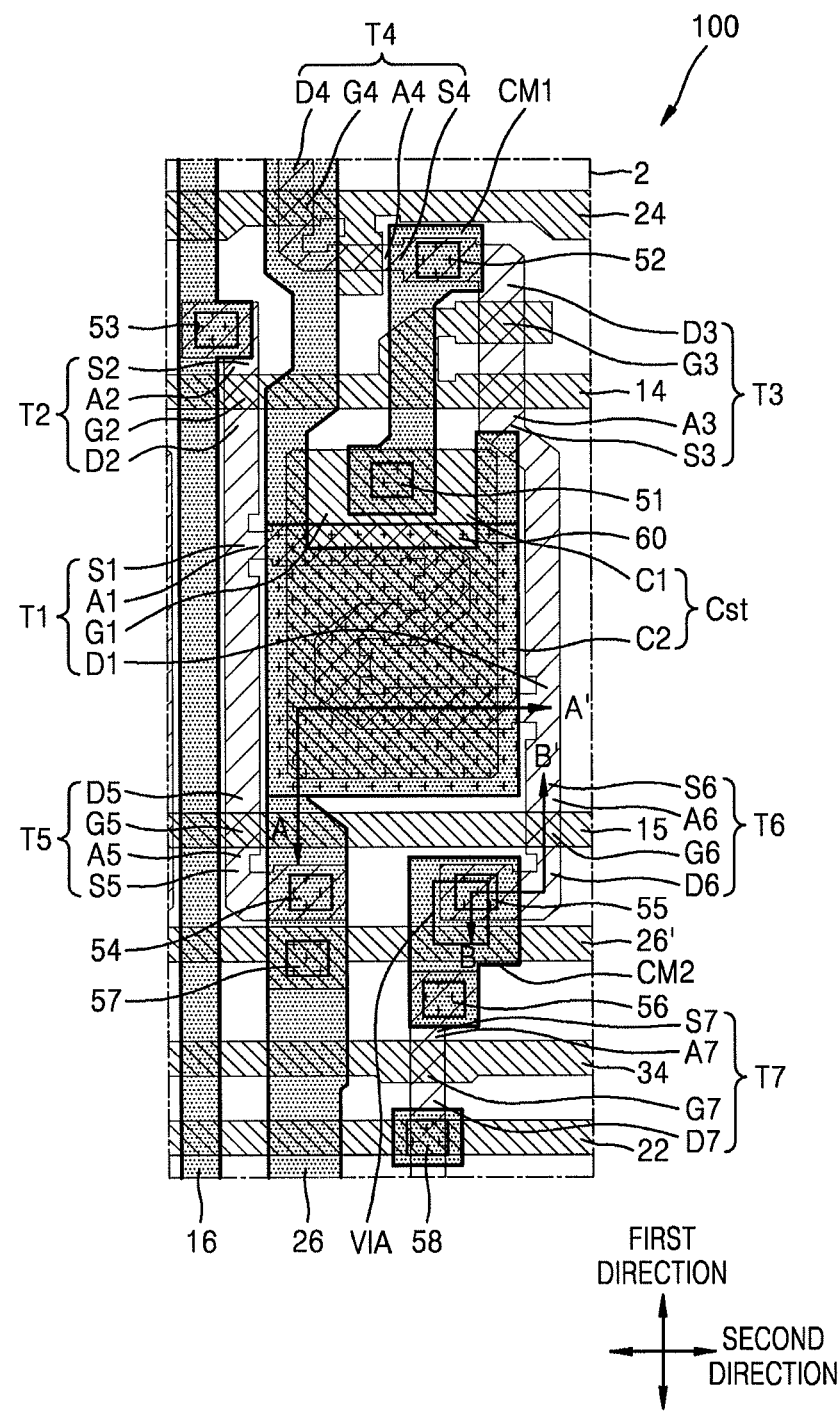
FIG. 3 illustrates an embodiment of a pixel circuit.

FIG. 3 illustrates an embodiment of a pixel circuit 2 of a TFT array substrate 100, which, for example, may be included in the organic light-emitting display apparatus 1000. The TFT array substrate 100 is a substrate which includes at least one TFT. The TFTs may be regularly or irregularly arranged on the TFT array substrate 100, or only one TFT may be on the TFT array substrate 100.

In an alternative embodiment, instead of the TFT array substrate 100 being applied to the organic light-emitting display apparatus 1000, the TFT array substrate 100 may be applied to any one of various display apparatuses such as but not limited to a liquid crystal display apparatus, an electrophoresis display apparatus, and a plasma display apparatus.

Referring to FIG. 3, the driving TFT T1, the data transmission TFT T2, the data transmission TFT T2, the compensation TFT T3, the first initialization TFT T4, the first emission control TFT T5, the second emission control TFT T6, the second initialization TFT T7, and the storage capacitor Cst may be in the pixel circuit 2.

The driving TFT T1 includes a driving semiconductor layer A1, the driving gate electrode G1, the driving source electrode S1, and the driving drain electrode D1. The driving source electrode S1 corresponds to an impurity-doped driving source region in the driving semiconductor layer A1. The driving drain electrode D1 corresponds to an impurity-doped driving drain region in the driving semiconductor layer A1. A region between the impurity-doped driving source region and the impurity-doped driving drain region corresponds to a driving channel region in the driving semiconductor layer A1.

The driving gate electrode G1 is connected to the first electrode C1 of the storage capacitor Cst, the compensation drain electrode D3 of the compensation TFT T3 and the first initialization source electrode S4 of the first initialization TFT T4. For example, the driving gate electrode G1 is integrally formed with the first electrode C1 on the same layer. The driving gate electrode G1 is connected to the compensation drain electrode D3 and the first initialization source electrode S4 by a first contact metal CM1 through a first contact hole 51 and a second contact hole 52. The driving channel region of the driving TFT T1 is curved. In FIG. 3, the driving channel region of the driving TFT T1 may have an S shape. In another embodiment, the driving channel region may have a different shape, such as an M or W shape.

By forming the driving channel region to curve, the driving channel region may be elongated in a narrow space. Elongating the driving channel region of the driving TFT T1 may increase the driving range of a gate voltage of the driving gate electrode G1. Accordingly, by changing the level of a driving gate voltage, the grayscale value of light emitted from the organic light-emitting diode OLED may be precisely controlled. As a result, the resolution and display quality of the organic light-emitting display apparatus 1000 may be improved.

The data transmission TFT T2 includes a data transmission semiconductor layer A2, the data transmission gate electrode G2, the data transmission source electrode S2, and the data transmission drain electrode D2. The data transmission source electrode S2 corresponds to an impurity-doped switching source region in the data transmission semiconductor layer A2. The data transmission drain electrode D2 corresponds to an impurity-doped switching drain region in the data transmission semiconductor layer A2. The data transmission source electrode S2 is connected to the data line 16 through a third contact hole 53. The data transmission drain electrode D2 is connected to the driving TFT T1 and the first emission control TFT T5. The data transmission gate electrode G2 is formed as a part of the first scanning line 14.

The compensation TFT T3 includes a compensation semiconductor layer A3, the compensation gate electrode G3, the compensation source electrode S3, and the compensation drain electrode D3. The compensation source electrode S3 corresponds to an impurity-doped compensation source region in the compensation semiconductor layer A3. The compensation drain electrode D3 corresponds to an impurity-doped compensation drain region in the compensation semiconductor layer A3. The compensation gate electrode G3 prevents a leakage current by forming a dual-gate electrode, using part of the first scanning line 14 and part of protruding wire, which extends from the first scanning line 14.

The first initialization TFT T4 includes a first initialization semiconductor layer A4, the first initialization gate electrode G4, the first initialization source electrode S4, and the first initialization drain electrode D4. The first initialization source electrode S4 corresponds to an impurity-doped first initialization source region in the first initialization semiconductor layer A4, and the first initialization drain electrode D4 corresponds to an impurity-doped first initialization drain region in the first initialization semiconductor layer A4. The first initialization drain electrode D4 may be connected to the second initialization TFT T7. The first initialization source electrode S4 may be connected to the driving gate electrode G1 and the first electrode C1 of the storage capacitor Cst through the first contact metal CM1 in the second contact hole 52 and the first contact hole 51. The first initialization gate electrode G4 may be part of the second scanning line 24. The first initialization gate electrode G4 forms a dual-gate electrode based on part of a protruding wire which extends from the second scanning line 24.

The first emission control TFT T5 includes a first emission control semiconductor layer A5, the first emission control gate electrode G5, the first emission control source electrode S5, and the first emission control drain electrode D5. The first emission control source electrode S5 corresponds to an impurity-doped first emission control source region in the first emission control semiconductor layer A5. The first emission control drain electrode D5 corresponds to an impurity-doped first emission control drain region in the first emission control semiconductor layer A5. The first emission control source electrode S5 may be connected to the driving voltage line 26 through a fourth contact hole 54. The first emission control gate electrode G5 is formed as a part of the emission control line 15.

The second emission control TFT T6 includes a second emission control semiconductor layer A6, the second emission control gate electrode G6, the second emission control source electrode S6, and the second emission control drain electrode D6. The second emission control source electrode S6 corresponds to an impurity-doped second emission control source region in the second emission control semiconductor layer A6. The second emission control drain electrode D6 corresponds to an impurity-doped second emission control drain region in the second emission control semiconductor layer A6. The second emission control drain electrode D6 is connected a second contact metal CM2 connected to a fifth contact hole 55, and to the pixel electrode of the organic light-emitting diode OLED through a via hole VIA connected to the second contact metal CM2. The second emission control gate electrode G6 is formed as a part of the emission control line 15.

The second initialization TFT T7 includes a second initialization semiconductor layer A7, the second initialization gate electrode G7, the second initialization source electrode S7, and the second initialization drain electrode D7. The second initialization source electrode S7 corresponds to an impurity-doped second initialization source region in the second initialization semiconductor layer A7. The second initialization drain electrode D7 corresponds to an impurity-doped second initialization drain region in the second initialization semiconductor layer A7. The second initialization drain electrode D7 may be connected to the initialization voltage line 22 through an eighth contact hole 58. The second initialization source electrode S7 is connected to the second contact metal CM2 connected to a sixth contact hole 56. The pixel electrode of the organic light-emitting diode OLED through the via hole VIA connected to the second contact metal CM2. The second initialization gate electrode G7 may be part of third scanning line 34.

The first electrode C1 of the storage capacitor Cst is directly connected to the driving gate electrode G1, and is connected to the first initialization TFT T4 and the compensation TFT T3 through the first contact metal CM1 included in the first contact hole 51 and the second contact hole 52. The first electrode C1 is disposed to overlap the driving semiconductor layer A1.

The second electrode C2 of the storage capacitor Cst at least partially overlaps the first electrode C1. The second electrode C2 may extend from the driving voltage line 26. The second electrode C2 is formed in an opening 60.

The first scanning line 14, the second scanning line 24, the third scanning line 34, and the emission control line 15 are all formed on the same layer and extend in a second direction. The first scanning line 14, the second scanning line 24, the third scanning line 34, a mesh driving voltage line 26' the initialization voltage line 22, and the emission control line 15 may be formed on the same layer as the first electrode C1 of the storage capacitor Cst.

The mesh driving voltage line 26' may prevent a voltage drop of the first power voltage ELVDD according to a location of the display unit 10. The mesh driving voltage line 26' may be on a different layer from the driving voltage line 26 and may cross the driving voltage line 26. The mesh driving voltage line 26' may contact the driving voltage line 26 via a seventh contact hole 57.

The data line 16, the driving voltage line 26, the first contact metal CM1, and the second contact metal CM2 may be all formed on the same layer and extend in a first direction.

Wires extending in the first direction and wires extending in the second direction may be on different layers, but may overlap each other at intersections. If the distance between the wires is close at the intersection, parasitic capacitance may be generated between the wires, and signals transmitted by the wires may interfere. In one or more embodiments, a second interlayer insulating film ILD2 in FIG. 4 may block the parasitic capacitance and/or the interference.

Figure 4:
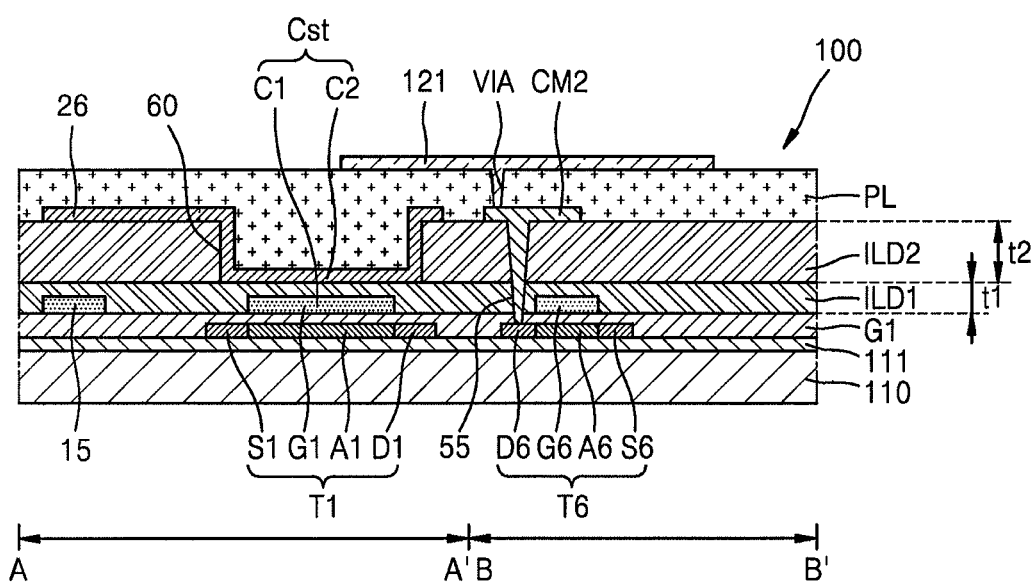
FIG. 4 illustrates a sectional view along a lines A-A' and B-B' in FIG. 3.

FIG. 4 is a cross-sectional view taken along a line A-A' and a line B-B' in FIG. 3. In FIG. 4, in order to more clearly show characteristics of one or more embodiments, some components (e.g., wires, electrodes, and semiconductor layers) are not included. Thus, the views in FIG. 4 may be different from actual cross-sectional views taken along the lines A-A' and B-B' of FIG. 3.

Referring to FIG. 4, the TFT array substrate 100 includes a first wire on the same layer as the driving TFT T1, the storage capacitor Cst, and the driving gate electrode G1 on a substrate 110, a second wire insulated from and at least partially overlapping the first wire, a first interlayer insulating film ILD1, and the second interlayer insulating film ILD2. The first and second interlayer ILD1 and the second interlayer insulating film ILD2 are stacked between the first and second wires. The first interlayer insulating film ILD1 is between the first and second electrodes C1 and C2 of the storage capacitor Cst.

In FIG. 4, the first wire corresponds to the emission control line 15 and the second wire corresponds to the driving voltage line 26. The first wire may include the first scanning line 14, the second scanning line 24, the third scanning line 34, the initialization voltage line 22, and the mesh driving voltage line 26', which are disposed on the same layer as the driving gate electrode G1. The second wire may include the data line 16, the first contact metal CM1, and the second contact metal CM2, which are on a top surface of the second interlayer insulating film ILD2.

Also, the TFT array substrate 100 may include the driving TFT T1, the storage capacitor Cst, switching TFTs, the first interlayer insulating film ILD1, and the second interlayer insulating film ILD2. The switching TFTs include TFTs (excluding the driving TFT T1) that perform switching operations. For example, the switching TFTs may include the data transmission TFT T2, the compensation TFT T3, the first initialization TFT T4, the first emission control TFT T5, the second emission control TFT T6, and the second initialization TFT T7. In FIG. 4, the second emission control TFT T7 corresponds to the switching TFT.

The first and second interlayer insulating films ILD1 and ILD2 are stacked on the switching TFT. The first interlayer insulating film ILD1 is between the first and second electrodes C1 and C2 of the storage capacitor Cst.

Various wires and TFTs may be provided for high performance and/or high integration of the TFT array substrate 100. These wires may overlap each other and/or the wires and TFTs may overlap each other. Accordingly, parasitic capacitance and/or signal interference may be generated in the TFT array substrate 100.

The second interlayer insulating film ILD2 may be additionally disposed between the various wires and/or between the various wires and the various TFTs, to thereby reduce parasitic capacitance and/or signal interference. Since the second interlayer insulating film ILD2 is not between the first and second electrode C1 and C2 of the storage capacitor Cst, the TFT array substrate 100 may maintain high storage capacitance.

The first interlayer insulating film ILD1 is used to secure store capacitance of the storage capacitor Cst. In order to increase the storage capacitance, a thickness t1 of the first interlayer insulating film ILD1 may be thinly formed and/or the first interlayer insulating film ILD1 may be formed of a material having a high dielectric constant.

The second interlayer insulating film ILD2 may reduce parasitic capacitance. In order to reduce the parasitic capacitance, a thickness t2 of the second interlayer insulating film ILD2 may be thinly formed and/or the second interlayer insulating film ILD2 may be formed of a material having a low dielectric constant.

According to some embodiments, the thickness t2 of the second interlayer insulating film ILD2 may be greater than the thickness t1 of the first interlayer insulating film ILD1. For example, the thickness t2 of the second interlayer insulating film ILD2 may be greater than the thickness t1 of the first interlayer insulating film ILD1 by about 2 to 5 times. The thickness t2 of the second interlayer insulating film ILD2 may be from about 1 to 5 um. The thickness t1 of the first interlayer insulating film ILD1 may be from about 0.2 to 1 um. In another embodiment, the thicknesses t1 and t2 may be in different ranges. For example, the thickness t2 of the second interlayer insulating film ILD2 may be thinner or the same as the thickness t1 of the first interlayer insulating film ILD1.

According one embodiment, the dielectric constant of the second interlayer insulating film ILD2 may be less than a dielectric constant of the first interlayer insulating film ILD1. According to one embodiment, the second interlayer insulating film ILD2 may include an organic material and the first interlayer insulating film ILD1 may include an inorganic material. The thickness t2 of the second interlayer insulating film ILD2 may be relatively thick when the second interlayer insulating film ILD2 includes an organic material, compared to when the second interlayer insulating film ILD2 includes an inorganic material.

If the second interlayer insulating film ILD2 includes an organic material and the first interlayer insulating film ILD1 includes an inorganic material, the selection of materials having a low dielectric constant may be greater than for the second interlayer insulating film ILD2, and the thickness t2 and width of the second interlayer insulating film ILD2 may be greater compared to the first interlayer insulating film ILD1.

Referring again to FIG. 4, a buffer layer 111 may be on the substrate 110. The buffer layer 111 may operate as a barrier layer and/or a blocking layer for preventing impure ions from spreading, for preventing moisture or external air from penetrating, for surface flattening.

The driving semiconductor layer A1 of the driving TFT T1, and the second emission control semiconductor layer A6 of the second emission control TFT T6 are on the buffer layer 111. The driving semiconductor layer A1 and the second emission control semiconductor layer A6 may include, for example, poly silicon. Also, each of the driving and second emission control semiconductor layers A1 and A6 may include a channel region that is not doped with an impurity, and source and drain regions on respective sides of the channel region and doped with impurities. The type of impurity may be different depending, for example, on the type of TFT, and may be an N-type or P-type impurity.

The data transmission semiconductor layer A2 of the data transmission TFT T2, the compensation semiconductor layer A3 of the compensation TFT T3, the first initialization semiconductor layer A4 of the first initialization TFT T4, the second initialization semiconductor layer A7 of the second initialization TFT T7, and the first emission control semiconductor layer A5 of the first emission control TFT T5 may be connected to the driving semiconductor layer A1 and the second emission control semiconductor layer A6 and may be simultaneously formed.

The gate insulating film GI may be on an entire surface of the substrate 110 to cover the driving semiconductor layer A1, the data transmission semiconductor layer A2, the compensation semiconductor layer A3, the first initialization semiconductor layer A4, the first emission control semiconductor layer A5, the second emission control semiconductor layer A6, and the second initialization semiconductor layer A7.

The gate insulating film GI may be a multilayer film or a single-layer film including an inorganic material, e.g., silicon oxide or silicon nitride. The gate insulating film GI insulates the driving semiconductor layer A1, the data transmission semiconductor layer A2, the compensation semiconductor layer A3, the first initialization semiconductor layer A4, the first emission control semiconductor layer A5, the second emission control semiconductor layer A6, and the second initialization semiconductor layer A7 from the driving gate electrode G1, the data transmission gate electrode G2, the compensation gate electrode G3, the first initialization gate electrode G4, the first emission control gate electrode G5, the second emission control gate electrode G6, and the second initialization gate electrode G7.

The second emission control gate electrode G6 of the second emission control TFT T6, the driving gate electrode G1 of the driving TFT T1, the first electrode C1 of the storage capacitor Cst, and the emission control line 15 are on the gate insulating film GI. The driving gate electrode G1 may be integrally formed with the first electrode C1.

The driving gate electrode G1, the data transmission gate electrode G2, the compensation gate electrode G3, the first initialization gate electrode G4, the first emission control gate electrode G5, the second emission control gate electrode G6, the second initialization gate electrode G7, the first scanning line 14, the second scanning line 24, the third scanning line 34, the mesh driving voltage line 26', and the initialization voltage line 22 may also be on the same layer and include a same material as the driving gate electrode G1, the second emission control gate electrode G6, the first electrode C1, and the emission control line 15.

The driving gate electrode G1, the second emission control gate electrode G6, the first electrode C1, and the emission control line 15 may each be formed of at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), or copper (Cu).

According to an exemplary embodiment, the storage capacitor Cst may overlap the driving TFT T1. For example, since the driving gate electrode G1 and the first electrode C1 are integrally formed, the storage capacitor Cst and the driving TFT T1 overlap each other. Since the storage capacitor Cst overlaps the driving TFT T1, areas of the first and second electrodes C1 and C2 are sufficiently secured. Accordingly, the storage capacitance of the storage capacitor Cst may be sufficiently secured.

The first interlayer insulating film ILD1 may be on the entire surface of the substrate 110 to cover the driving gate electrode G1, the second emission control gate electrode G6, the first electrode C1, and the emission control line 15. The first interlayer insulating film ILD1 may include an inorganic material or an organic material.

Inorganic material for the first interlayer insulating film ILD1 may include a metal oxide or a metal nitride. For example, the inorganic material may be silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In one embodiment, the first interlayer insulating film ILD1 may include a material having a dielectric constant, for example, from 4 to 7.

The first interlayer insulating film ILD1 may be a multilayer film or a single-layer film including inorganic material, e.g., SiOx and/or SiNx. In one embodiment, the first interlayer insulating film ILD1 may have a double structure of SiOx/SiNy or SiNx/SiOy.

The first interlayer insulating film ILD1 may insulate the driving gate electrode G1, the second emission control gate electrode G6, the first electrode C1, and the emission control line 15 from wires on the first interlayer insulating film ILD1. Also, the first interlayer insulating film ILD1 may operate as a dielectric layer of the storage capacitor Cst. The thickness t1 of the first interlayer insulating film ILD1 may be less than the thickness t2 of the second interlayer insulating film ILD2. The thickness t1 of the first interlayer insulating film ILD1 may be set, for example, taking the storage capacitance of the storage capacitor Cst into consideration.

The second interlayer insulating film ILD2 is on the first interlayer insulating film ILD1, and includes the opening 60 that exposes part of the first interlayer insulating film ILD1. The second electrode C2 of the storage capacitor Cst is in the opening 60.

The second interlayer insulating film ILD2 may include an inorganic material or an organic material. For example, the second interlayer insulating film ILD2 may include at least one of polyacrylates resin, epoxy resin, phenolic resin, polyamides resin, polyimide resin, unsaturated polyesters resin, polyphenylene ether resin, polyphenylene sulfide resin, or benzocyclobutene (BCB). In one embodiment, the second interlayer insulating film ILD2 may include a material having a dielectric constant, for example, from 2 to 4.

In one embodiment, the thickness t2 of the second interlayer insulating film ILD2 may be greater than the thickness t1 of the first interlayer insulating film ILD1. For example, the thickness t2 of the second interlayer insulating film ILD2 may be greater than the thickness t1 of the first interlayer insulating film ILD1 by about 2 to 5 times. The thickness t2 of the second interlayer insulating film ILD2 may be from about 1 to 5 um. The thickness t1 of the first interlayer insulating film ILD1 may be from about 0.2 to 1 um.

The second electrode C2 of the storage capacitor Cst is in the opening 60 of the second interlayer insulating film ILD2. Since the second electrode C2 overlaps the first electrode C1, the opening 60 is in a region overlapping the first electrode C1. The second electrode C2 may be in the opening 60 to contact a top surface of the first interlayer insulating film ILD1. Also, the second electrode C2 may extend along a side wall of the opening 60 to the top surface of the second interlayer insulating film ILD2. In another embodiment, the second electrode C2 may only be inside the opening 60.

Because the second electrode C2 of the storage capacitor Cst is in the opening 60 of the second interlayer insulating film ILD2, the storage capacitance of the storage capacitor Cst depends upon the dielectric constant and the thickness t1 of the first interlayer insulating film ILD1. Accordingly, the storage capacitance of the storage capacitor Cst may be secured by setting the material and thickness t1 of the first interlayer insulating film ILD1 regardless of the second interlayer insulating film ILD2.

The driving voltage line 26 and the second contact metal CM2 are on the second interlayer insulating film ILD2. The data line 16 and the first contact metal CM1 may be on the second interlayer insulating film ILD2. The driving voltage line 26, the second contact metal CM2, the data line 16, and the first contact metal CM1 may include at least one of Al, Pt, Pd, Ag, Mg, Au, Ni, Nd, Ir, Cr, Li, Ca, Mo, Ti, W, or Cu. In one embodiment, the driving voltage line 26, the second contact metal CM2, the data line 16, and the first contact metal CM1 may include Ti/Al/Ti, Mo/Al/Mo, Mo/AlGe/Mo, or Ti/Cu.

The driving voltage line 26 may extend from the second electrode C2 of the storage capacitor Cst. However, since the driving voltage line 26 is on the top surface of the second interlayer insulating film ILD2, the first and second interlayer insulating films ILD1 and ILD2 are stacked below the driving voltage line 26. That is, since the first and second interlayer insulating films ILD1 and ILD2 are stacked between the driving voltage line 26 and the emission control line 15, parasitic capacitance between the driving voltage line 26 and the emission control line 15 may be reduced or prevented.

The first and second interlayer insulating films ILD1 and ILD2 are stacked on the second emission control TFT T6. Accordingly, parasitic capacitance between the second emission control TFT T6 and the second contact metal CM2 may be reduced or prevented. The second contact metal CM2 may be connected to the second emission control drain electrode D6 of the second emission control TFT through the fifth contact hole 55.

A planarization layer PL is formed on the entire surface of the substrate 110 to cover a wire, such as the data line 16, the driving voltage line 26, the first contact metal CM1, or the second contact metal CM2. A pixel electrode 121 may be formed on the planarization layer PL. The pixel electrode 121 is connected to the second contact metal CM2 through the via hole VIA, in order to be connected to the second emission control drain electrode D6 and the second initialization source electrode S7. The pixel electrode 121 is illustrated in FIG. 4.

The planarization layer PL may include an insulating material. For example, the planarization layer PL may have a single-layer or multiple-layer structure that includes an inorganic material, an organic material, or an inorganic and organic complex. The planarization layer PL may be formed using any one of various deposition methods. In one embodiment, the planarization layer PL may include at least one of polyacrylates resin, epoxy resin, phenolic resin, polyamides resin, polyimide resin, unsaturated polyesters resin, polyphenylene ether resin, polyphenylene sulfide resin, or BCB.

In FIGS. 3 and 4, one of source or drain electrodes of a TFT, which is not connected to another wire, is formed on the same layer as a semiconductor layer. For example, the source and drain electrodes of the TFT may include polysilicon with which a doping material is selectively doped. In one embodiment, each of the source and drain electrodes of the TFT may be formed on a different layer from the semiconductor layer, and may be connected to source and drain regions of the semiconductor layer, for example, via contact holes.

Figure 5:
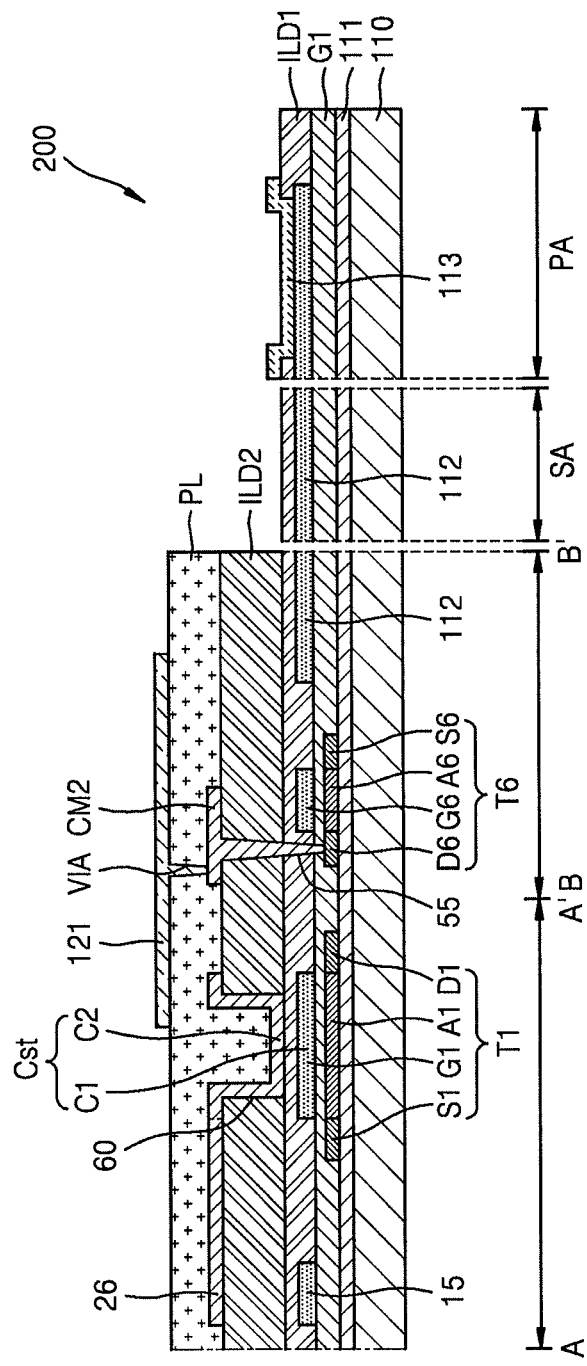
FIG. 5 illustrates an embodiment of a TFT array substrate.

FIG. 5 is a cross-sectional view of another embodiment of a TFT array substrate 200. Referring to FIG. 5, the TFT array substrate 200 includes a first wire and a second sire. The first wire is on the same layer as the driving TFT T1, the storage capacitor Cst, and the driving gate electrode G1 on the substrate 110. The second wire is insulated from and at least partially overlaps the first wire, the first interlayer insulating film ILD1, and the second interlayer insulating film ILD2.

The first and second interlayer insulating films ILD1 and ILD2 are stacked between the first and second wires. The first interlayer insulating film ILD1 is between the first and second electrodes C1 and C2 of the storage capacitor Cst.

In FIG. 5, the first wire corresponds to the emission control line 15 and the second wire corresponds to the driving voltage line 26. In one embodiment, the first wire may include the first scanning line 14, the second scanning line 24, the third scanning line 34, the initialization voltage line 22, and the mesh driving voltage line 26'a, which are on the same layer as the driving gate electrode G1. The second wire may include the data line 16, the first contact metal CM1, and the second contact metal CM2.

The TFT array substrate 200 may also include the driving TFT T1, the storage capacitor Cst, and switching TFTs such as the data transmission TFT T2, the compensation TFT T3, the first initialization TFT T4, the first emission control TFT T5, the second emission control TFT T6, and the second initialization TFT T7. The TFT array substrate 200 may also include the first interlayer insulating film ILD1 and the second interlayer insulating film ILD2. The first and second interlayer insulating films ILD1 and ILD2 are stacked on the switching TFTs. The first interlayer insulating film ILD1 is between the first and second electrodes C1 and C2 of the storage capacitor Cst.

The TFT array substrate 200 of FIG. 5 also includes a pad region PA and/or a sealing region SA. The pad region PA may be around a region where the pixel circuit 2 of FIG. 3 in the cross-sectional views taken along the lines A-A' and B-B' is formed. The pad region PA may include at least one pad 13. The pad region PA is a region where various components for driving the pixel circuit 2 and other modules are mounted. The pad region PA may include, for example, a driver integrated circuit (IC), the pad 113 connecting the driver IC and the pixel circuit 2, and a fan out wire 112.

The driver IC may include a data driver for supplying a data signal, and may further include various functional units for driving the pixel circuit 2. The driver IC may be, for example, a chip-on-glass (COG) type mounted on the substrate 110. The driver IC includes a connection terminal which is electrically connected to the pad 113 on the substrate 110. The pad 113 and the connection terminal may be bonded, for example, by a conductive adhesive material and may include a conductive ball. Examples of the conductive adhesive material include an anisotropic conductive film and a self-organizing conductive film.

The pad 113 is on the substrate 110 with the connection terminal of the driver IC electrically connected thereto. The pad 113 is electrically connected to the fan out wire 112. As shown in FIG. 5, the pad 113 may be on a different layer from the fan out wire 112. In one embodiment, the pad 113 may extend from the fan out wire 112 and may be on the same layer as the fan out wire 112. The pad 113 may be a single layer or a multilayer which includes at least one of Al, Cu, Ag, or Ti.

The fan out wire 112 may connect the pad 113 to the pixel circuit 2. For example, the fan out wire 112 may be on the same layer and include the same material as gate electrodes, e.g., the driving gate electrode G1, the data transmission gate electrode G2, the compensation gate electrode G3, the first initialization gate electrode G4, the first emission control gate electrode G5, the second emission control gate electrode G6, and the second initialization gate electrode G7, the first electrode C1 of the storage capacitor Cst, the first through third scanning lines 14, 24, and 34, or the emission control line 15. Thus, the fan out wire 112 may be on the gate insulating film GI.

The first interlayer insulating film ILD1 including a ninth contact hole 59 may be on the fan out wire 112. In this case, the pad 113 may be connected to the fan out wire 112 through the ninth contact hole 59. The fan out wire 112 has one side connected to the pad 113 and another side connected to the pixel circuit 2, to thereby transmit a signal from the driver IC to the pixel circuit 2.

The sealing region SA includes a sealing material for sealing a region which includes the pixel circuit 2. The sealing region SA may surround a region including at least one pixel circuit 2. Also, the sealing region SA may be between the region where the pixel circuit 2 is formed and the pad region PA.

The sealing region SA may not include the second interlayer insulating film ILD2, for example, when the second interlayer insulating film ILD2 includes an organic material. For example, when the second interlayer insulating film ILD2 includes an organic material, the second interlayer insulating film ILD2 may be damaged when the sealing material disposed in the sealing region SA is hardened via a laser beam.

Accordingly, the substrate 110, the buffer layer 111, the gate insulating film GI, the fan out wire 112, and the first interlayer insulating film ILD1 may be sequentially stacked in the stated order in the sealing region SA. Alternatively, at least one of the buffer layer 111, the gate insulating film GI, the fan out wire 112, or the first interlayer insulating film ILD1 may not be disposed in the sealing region SA.

FIGS. 6A to 6D illustrating stages of an embodiment of a method for manufacturing a TFT array substrate, which, for example, may be TFT array substrate 100 or 200. For illustrative purposes, the method will be described for manufacturing the TFT array substrate 200 in FIG. 5.

Figure 6A:
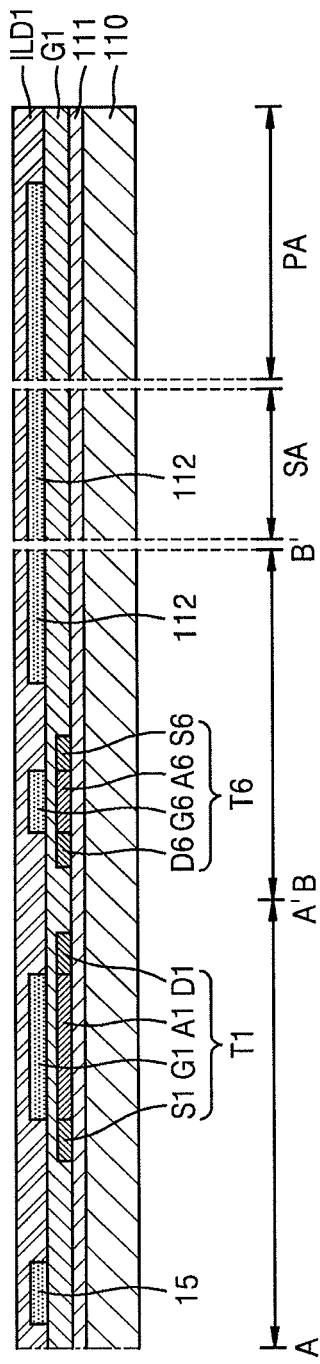
FIGS. 6A-6D illustrate stages in an embodiment of a method for manufacturing a TFT array substrate.

Referring to FIG. 6A, a plurality of TFTs (e.g., the driving TFT T1, the data transmission TFT T2, the compensation TFT T3, the first initialization TFT T4, the first emission control TFT T5, the second emission control TFT 6, and the second initialization TFT T7) are formed on the substrate 110.

First, semiconductor layers (e.g., the driving semiconductor layer A1, the data transmission semiconductor layer A2, the compensation semiconductor layer A3, the first initialization semiconductor layer A4, the first emission control semiconductor layer A5, the second emission control semiconductor layer A6, and the second initialization semiconductor layer A7) of the TFTs are formed, and then the gate insulating film GI is formed on the semiconductor layers.

The semiconductor layers may be formed of a semiconductor (e.g., amorphous silicon or crystalline silicon) and may be formed via one of various deposition methods. Crystalline silicon may be formed, for example, by crystallizing amorphous silicon. Examples of methods for crystallizing amorphous silicon include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. The semiconductor layers may be patterned via a photolithography process.

The gate insulating film GI insulates the semiconductor layers and gate electrodes (e.g., the driving gate electrode G1, the data transmission gate electrode G2, the compensation gate electrode G3, the first initialization gate electrode G4, the first emission control gate electrode G5, the second emission control gate electrode G6, and the second initialization gate electrode G7) to be formed on the semiconductor layers from each other. The gate insulating film GI may be formed on the entire surface of the substrate 110 while covering the semiconductor layers.

The gate insulating film GI may include an organic or inorganic insulating material. In one embodiment, the gate insulating film GI may include SiNx, SiO2, HfO, or AlO. The gate insulating film GI may be formed via one of various deposition methods such as a sputtering method, a chemical vapor deposition (CVD) method, and a plasma enhanced chemical vapor deposition (PECVD) method.

Then, the gate electrodes are formed on the gate insulating film GI to at least partially overlap the semiconductor layers. Also, the first through third scanning lines 14, 24, and 34, the emission control line 15, the initialization voltage line 22, the mesh driving voltage line 26', and the fan out wire 112 may be simultaneously formed with the gate electrodes. The gate electrodes may be formed of at least one of Mo, Al, Pt, Pd, Ag, Mg, Au, Ni, Nd, Ir, Cr, Li, Ca, Ti, W, or Cu.

Then, source electrodes (e.g., the driving source electrode S1, the data transmission source electrode S2, the compensation source electrode S3, the first initialization source electrode S4, the first emission control source electrode S5, the second emission control source electrode S6, and the second initialization source electrode S7) and drain electrodes (e.g., the driving drain electrode D1, the data transmission drain electrode D2, the compensation drain electrode D3, the first initialization drain electrode D4, the first emission control drain electrode D5, the second emission control drain electrode D6, and the second initialization drain electrode D7) may be formed by injecting impurities at ends of the semiconductor layers using the gate electrodes as masks. In one embodiment, a trivalent dopant (e.g., boron (B)) may be added as the impurities. Also, the source and drain electrodes may include, for example, p-type conductive material, When a pentavalent dopant (e.g., phosphor (P), arsenic (As), or antimony (Sb)) is added as the impurities, the source and drain electrodes may include n-type conductive material.

Then, the first interlayer insulating film ILD1 is formed on the entire surface of the substrate 110 to cover the gate electrodes, the emission control line 15, and the fan out wire 112. The first interlayer insulating film ILD1 may be a single layer film formed of an organic material or an inorganic material, or may have a stacked structure of such single layers. In one embodiment, the first interlayer insulating film ILD1 may be formed of SiNx, SiO$_2$, HfO, or AlO. In one embodiment, the first interlayer insulating film ILD1 may have a double structure of SiNx/SiOy or SiOy/SiNx. The first interlayer insulating film ILD1 may be formed via one of various deposition methods such as a sputtering method, a CVD method, and a PECVD method.

Figure 6B:
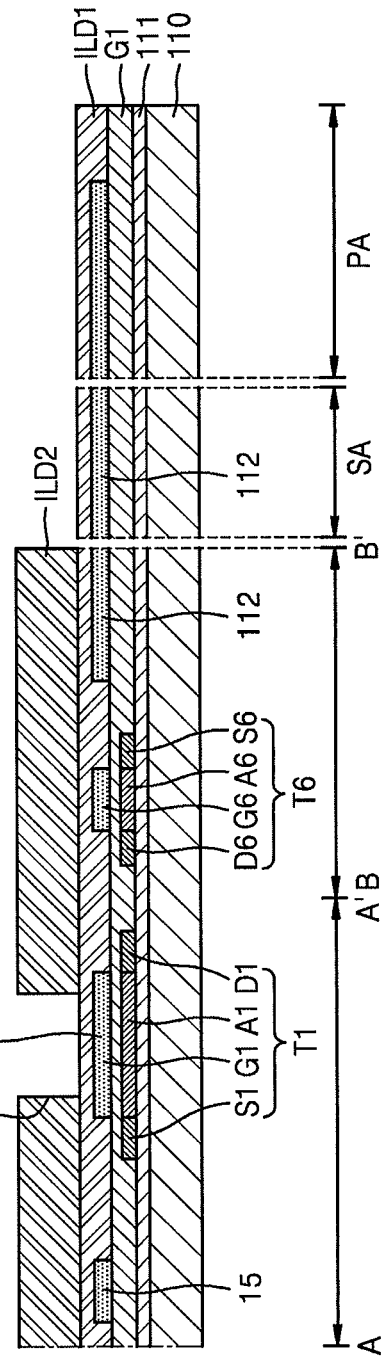

Referring to FIG. 6B, the second interlayer insulating film ILD2 including the opening 60 is formed. First, a preliminary-second interlayer insulating film is formed on the entire surface of the substrate 110. The preliminary-second interlayer insulating film may be a single layer film formed of an organic material or an inorganic material, or may have a stacked structure of such single layers. In one embodiment, the preliminary-second interlayer insulating film may be formed of at least one of polyacrylates resin, epoxy resin, phenolic resin, polyamides resin, polyimide resin, unsaturated polyesters resin, polyphenylene ether resin, polyphenylene sulfide resin, or BCB.

The preliminary-second interlayer insulating film may be formed via a spin coating process, a printing process, a sputtering process, a CVD process, an atomic layer deposition (ALD) process, a PECVD process, a high density plasma (HDP)-CVD process, or a vacuum deposition process based on a material forming the preliminary-second interlayer insulating film.

Then, the opening 60 is formed in a region where the second electrode C2 of the storage capacitor Cst is to be formed. The preliminary-second interlayer insulating film in the sealing region SA and the pad region PA are removed via one of various etching processes such as a wet etching process, a dry etching process, or a combination thereof.

Figure 6C:
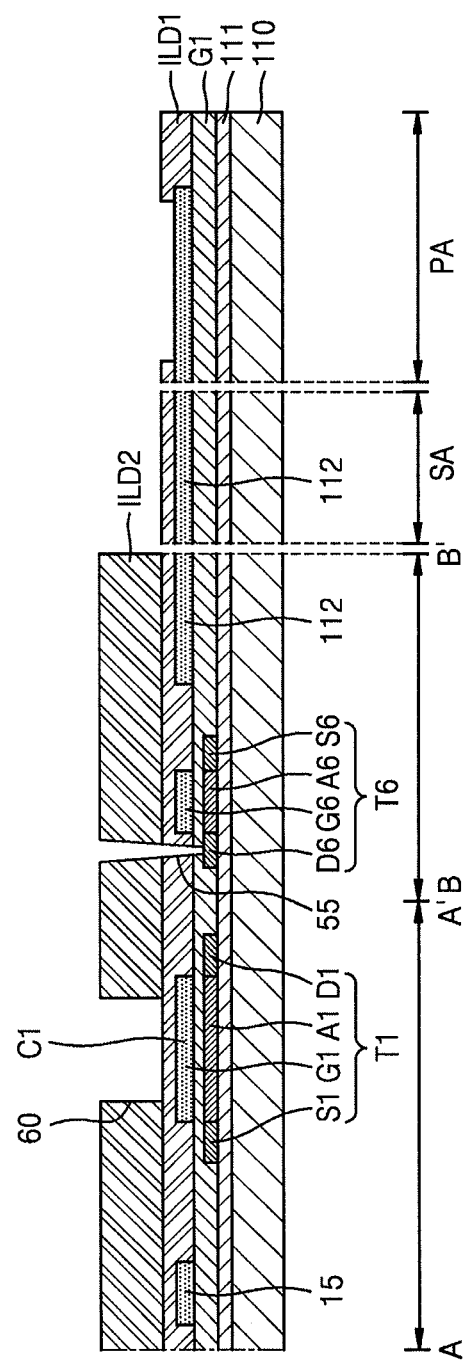

Referring to FIG. 6C, the first through ninth contact holes 51 through 59 penetrating through the first interlayer insulting film ILD1 are formed. The first through ninth contact holes 51 through 59 may be formed via a patterning process and an etching process using a mask. The etching process may be a wet etching process, a dry etching process, or a combination thereof.

The order of the forming of the opening 60 described with reference to FIG. 6B and formation of the first through ninth contact holes 51 through 59 described with reference to FIG. 6C may be changed. If the first through ninth contact holes 51 through 59 are formed first, widths of the first through ninth contact holes 51 through 59 in the first interlayer insulating film ILD1 may be less than those in the second interlayer insulating film ILD2.

Figure 6D:
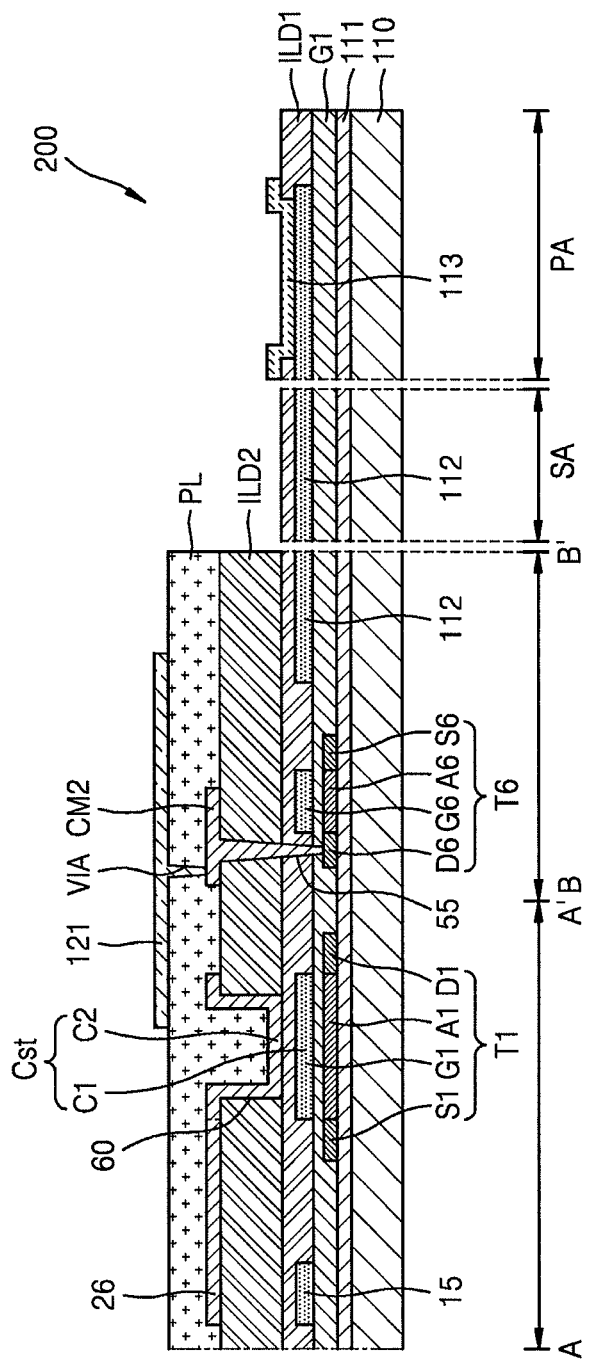

Referring to FIG. 6D, the second electrode C2 of the storage capacitor Cst is formed in the opening 60 of the second interlayer insulating film ILD2. Then, the second contact metal CM2 is formed on the top surface of the second interlayer insulating film ILD2 and the pad 113 is formed in the pad region PA.

Then, the planarization layer PL covering the storage capacitor Cst and the second contact metal CM2 is formed in a pixel circuit region. Then, the via hole VIA exposing the second contact metal CM2 is formed. The pixel electrode 121 connected to the second contact metal CM2 through the via hole VIA is formed on the planarization layer PL.

Figure 7:
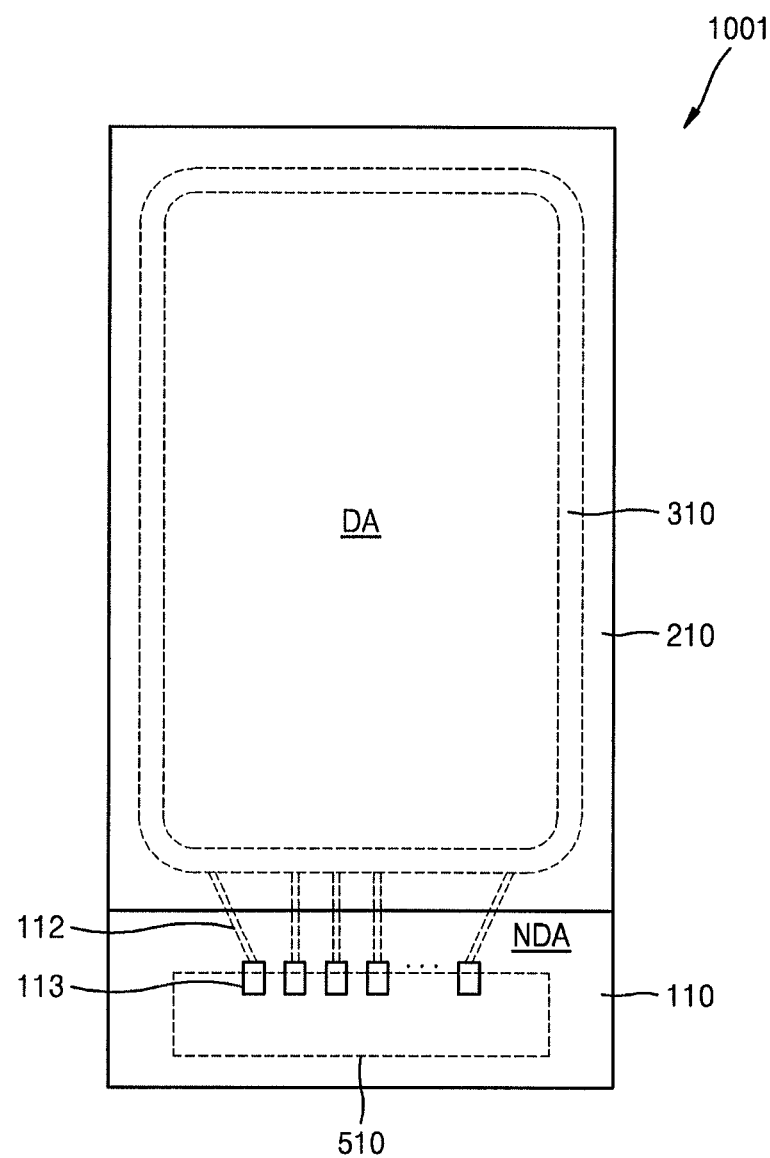
FIG. 7 illustrates another embodiment of an organic light-emitting display apparatus.
Figure 8:
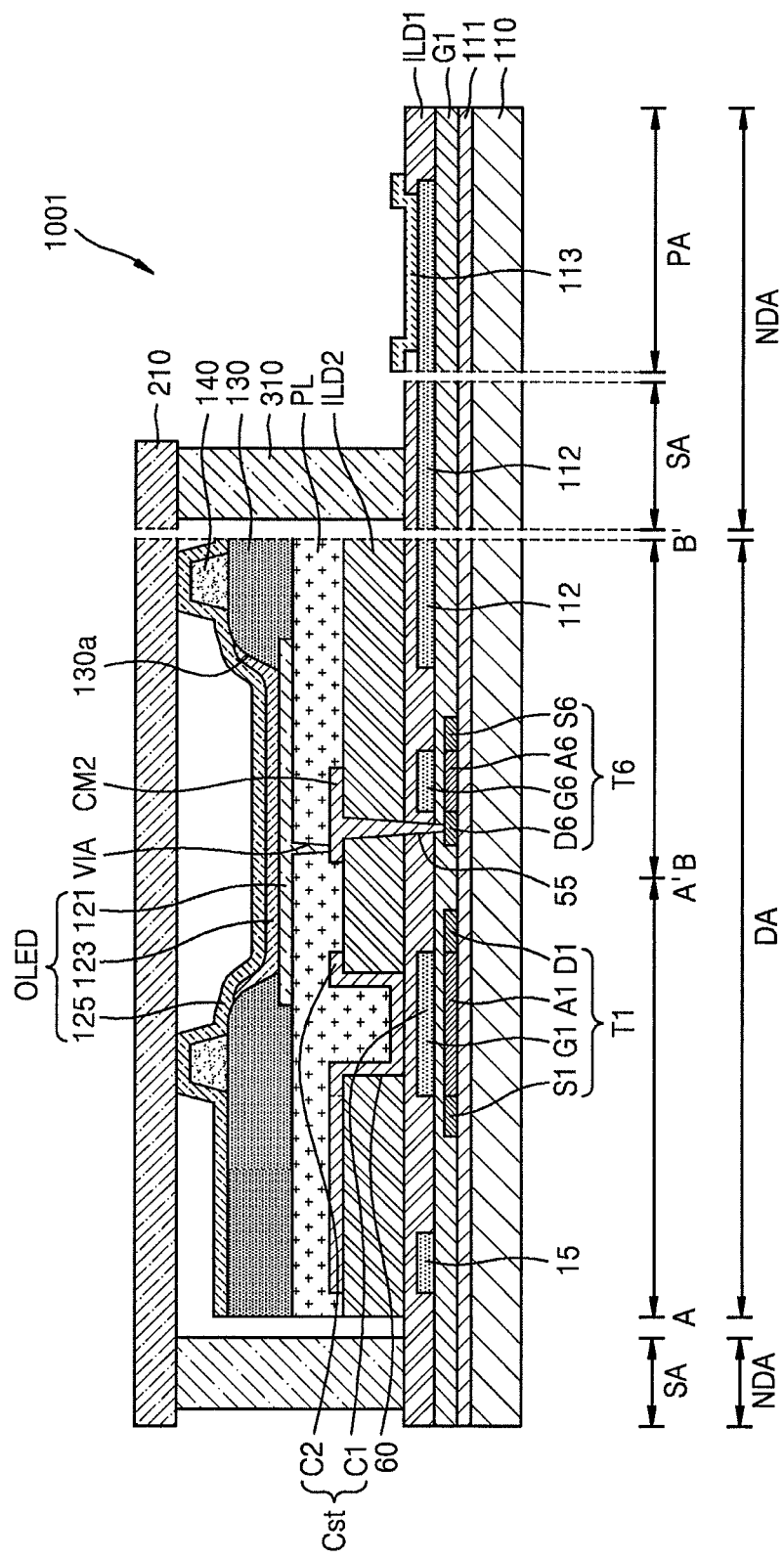
FIG. 8 illustrates a cross-section of the organic light-emitting display apparatus.

FIG. 7 illustrates another embodiment of an organic light-emitting display apparatus 1001, and FIG. 8 is a cross-sectional view of the organic light-emitting display apparatus 1001. Referring to FIGS. 7 and 8, the organic light-emitting display apparatus 1001 may include either of the TFT array substrates 100 or 200.

The organic light-emitting display apparatus 1001 includes a first wire and a second wire. The first wires is on the same layer as the driving TFT T1, the storage capacitor Cst, and the driving gate electrode G1 on the substrate 110. The second wire is insulated from and at least partially overlaps the first wire, the first interlayer insulating film ILD1, and the second interlayer insulating film ILD2. The first and second interlayer insulating films ILD1 and ILD2 are stacked between the first and second wires. The first interlayer insulating film ILD1 is between the first and second electrodes C1 and C2 of the storage capacitor Cst.

In FIGS. 7 and 8, the first wire corresponds to the emission control line 15 and the second wire corresponds to the driving voltage line 26. In one embodiment, the first wire may include the first scanning line 14, the second scanning line 24, the third scanning line 34, the initialization voltage line 22, and the mesh driving voltage line 26', disposed on the same layer as the driving gate electrode G1. The second wire may include the data line 16, the first contact metal CM1, and the second contact metal CM2.

The organic light-emitting display apparatus 1001 may also include the driving TFT T1, the storage capacitor Cst, the switching TFTs, the first interlayer insulating film ILD1, and the second interlayer insulating film ILD2. The first and second interlayer insulating films ILD1 and ILD2 are stacked on the switching TFTs. The first interlayer insulating film ILD1 is between the first and second electrodes C1 and C2 of the storage capacitor Cst.

The organic light-emitting display apparatus 1001 may also include at least one organic light-emitting diode OLED, a sealing substrate 210, a sealing material 310, or a driver IC 510.

The organic light-emitting display apparatus 1001 may include a display area DA where an image is displayed and a non-display area NDA around the display area DA. The non-display area NDA may include the sealing region SA and pad region PA.

The sealing material 310 for sealing the display area DA from external air may be in the sealing region SA to surround the display area DA. However, if the sealing substrate 210 is a thin-film encapsulation type, the sealing material 310 may be omitted. The sealing substrate 210 may block external air or moisture from penetrating into the TFTs and the organic light-emitting diode OLED on the substrate 110. A polarizing film or a color filter may optionally be disposed on the sealing substrate 210.

The sealing material 310 surrounds the display area DA and may include inorganic material such as frit or epoxy. Frit may be glass raw material in a powder state or in a paste state, and may include a laser or infrared ray absorbing material, an organic binder, or a filler for reducing a thermal expansion coefficient included in a main material, such as SiO2. The sealing material 310 may be coated, for example, via a dispenser or a screen printing method.

Frit in a paste state may be hardened as an organic binder and moisture may be removed via a drying or plasticizing process. The laser or infrared ray absorbing material may include a transition metal compound. A laser beam may be used as a heat source to harden the sealing material 310 to adhere the substrate 110 and the sealing substrate 210. If the sealing material 310 is hardened using a laser beam, a light absorption layer assisting the absorbing of the laser beam may be disposed below the sealing material 310. The light absorption layer may be formed of a conductive material having a high heat transfer rate.

The sealing material 310 may directly contact the first interlayer insulating film ILD1 therebelow. For example, the second interlayer insulating film ILD2 may not exist below the sealing material 310. This is because, when the second interlayer insulating film ILD2 is formed of an organic material, the second interlayer insulating film ILD2 may be damaged while the sealing material 310 is hardened and therefore the sealing may not be properly performed. If the second interlayer insulating film ILD2 is formed of an inorganic material, the second interlayer insulating film ILD2 may be formed below the sealing material 310.

The pad region PA may include various units for driving pixels in the display area DA, as well as other modules. The driver IC 510, the pad 113 connecting the driver IC 510 and a pixel, and the fan out wire 112 may be in the pad region PA.

Although the second interlayer insulating film ILD2 is not in pad region PA in FIG. 8, the second interlayer insulating film ILD2 may or may not be in pad region PA.

The organic light-emitting diode OLED of the TFT array substrate 100 or 200 is in the display area DA of the organic light-emitting display apparatus 1001. The organic light-emitting diode OLED includes the pixel electrode 121, an intermediate layer 123 including an organic emission layer, and a counter electrode 125. Also, the organic light-emitting display apparatus 1001 may include a pixel-defining film 130 and a spacer 140.

The pixel electrode 121 may be electrically connected to the second contact metal CM2 while filling the via hole VIA of the planarization layer PL. The pixel electrode 121 and/or the counter electrode 125 may be a transparent electrode or a reflective electrode. The transparent electrode may be formed of indium tin oxide (ITO), indium zinc oxide (IZO), zinc oxide (ZnO), or indium oxide (In$_2$O$_3$). The reflective electrode may be include a reflective film formed of Ag, Mg, Al, Pt, Pd, Au, Ni, Nd, Ir, Cr, or a compound thereof, and a transparent film formed of ITO, IZO, ZnO, or In$_2$O$_3$. In one embodiment, the pixel electrode 121 or the counter electrode 125 may have a ITO/Ag/ITO structure.

The pixel-defining film 130 may define a pixel region and a non-pixel region. The pixel-defining film 130 may include an opening 130a exposing the pixel electrode 121, and may entirely cover the TFT array substrate 100 or 200. The intermediate layer 123 is formed in the opening 130a, and thus the opening 130a may be the pixel region.

The organic light-emitting diode OLED includes the pixel electrode 121, the intermediate layer 123, and the counter electrode 125. Holes and electrons injected from the pixel electrode 121 and the counter electrode 125 of the organic light-emitting diode OLED may be combined in the organic emission layer of the intermediate layer 123 to emit light.

The intermediate layer 123 may include the organic emission layer. In one embodiment, the intermediate layer 123 may include the organic emission layer, and may further include at least one of a hole injection layer (HIL), a hole transport layer (HTL), an electron transport layer (ETL), or an electron injection layer (EIL). Alternatively, the intermediate layer 123 may include the organic emission layer and may further include various functional layers.

The counter electrode 125 is formed on the intermediate layer 123. The counter electrode 125 forms an electric field with pixel electrode 121 to allow light to be emitted from the intermediate layer 123. The pixel electrode 121 may be patterned according to pixels. The counter electrode 125 may apply a common voltage to all pixels.

The pixel electrode 121 and the counter electrode 125 may be a transparent electrode or a reflective electrode. The pixel electrode 121 may operate as an anode and the counter electrode 125 may operate as a cathode. In one embodiment, the pixel electrode 121 may operate as a cathode and the counter electrode 125 may operate as an anode.

In FIG. 8, one organic light-emitting diode OLED is shown, but the display panel may include a plurality of the organic light-emitting diodes OLEDs. One pixel may be formed per organic light-emitting diode OLED, and the OLEDs may be included in color pixels, e.g., red, green, blue, or white pixels.

The intermediate layer 123 may be commonly formed throughout the pixel electrode 121, regardless of a location of a pixel. The organic emission layer may be formed by perpendicularly stacking layers including red, green, and blue emitting materials, or by mixing red, green, and blue emitting materials. Another combination of colors is possible as long as white light is emitted. Also, a color filter, which converts white light to a certain color, may be further included.

A passivation layer may optionally be disposed on the counter electrode 125, and may cover and protect the organic light-emitting diode OLED. The passivation layer may be an inorganic insulating film and/or an organic insulating film.

The spacer 140 may be between pixel regions in the display area DA. The spacer 140 may maintain an interval between the substrate 110 and the sealing substrate 210, and may prevent a display characteristic from deteriorating from external impact.

The spacer 140 may be disposed on the pixel-defining film 130. The spacer 140 may protrude from the pixel-defining film 130 towards the sealing substrate 210. In one embodiment, the spacer 140 may include the same material and be formed via the same process as the pixel-defining film 130. For example, the pixel-defining film 130 and the spacer 140 may be simultaneously formed by adjusting an exposure amount via an exposure process using a half-tone mask. In another embodiment, the pixel-defining film 130 and the spacer 140 may be sequentially or separately formed, and may be individual structures formed using different materials.

By way of summation and review, in accordance with one or more of the aforementioned embodiments, an organic light-emitting display apparatus includes an interlayer insulting film (e.g., second interlayer insulating film ILD2) having an opening which includes an electrode of a storage capacitor. Such a structure may reduce or prevent parasitic capacitance while securing storage capacitance of the storage capacitor. Also, a TFT array substrate and an organic light-emitting display apparatus including the same may be formed with reduced parasitic capacitance.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A thin-film transistor (TFT) array substrate, comprising:
   a driving TFT on a substrate;
   a storage capacitor including a first electrode connected to a driving gate electrode of the driving TFT, and a second electrode on and insulated from the first electrode;
   a first wire on a same layer as the driving gate electrode;
   a first interlayer insulating film covering the first electrode and the first wire;
   a second interlayer insulating film on the first interlayer insulating film and including an opening that exposes part of the first interlayer insulating film; and
   a second wire on the second interlayer insulating film and at least partially overlapping the first wire, wherein the second electrode is in the opening of the second interlayer insulating film and wherein the driving gate electrode and the first electrode are integrally formed as one body on a same layer.

2. The substrate as claimed in claim 1, wherein a thickness of the second interlayer insulating film is greater than a thickness of the first interlayer insulating film.

3. The substrate as claimed in claim 1, wherein a thickness of the second interlayer insulating film is about 2 to 5 times greater than a thickness of the first interlayer insulating film.

4. The substrate as claimed in claim 1, wherein a dielectric constant of the second interlayer insulating film is lower than a dielectric constant of the first interlayer insulating film.

5. The substrate as claimed in claim 1, wherein:
   the first interlayer insulating film includes an inorganic material, and
   the second interlayer insulating film includes an organic material.

6. A thin-film transistor (TFT) array substrate, comprising:
   a driving TFT on a substrate;
   a storage capacitor including a first electrode connected to a driving gate electrode of the driving TFT, and a second electrode on and insulated from the first electrode;
   a first wire on a same layer as the driving gate electrode;
   a first interlayer insulating film covering the first electrode and the first wire;
   a second interlayer insulating film on the first interlayer insulating film and including an opening that exposes part of the first interlayer insulating film; and
   a second wire on the second interlayer insulating film and at least partially overlapping the first wire, wherein the second electrode is in the opening of the second interlayer insulating film, wherein the driving TFT includes:
   a driving semiconductor layer below the driving gate electrode and insulated by a first gate insulating film, wherein the driving semiconductor layer is curved.

7. The substrate as claimed in claim 1, wherein the second wire is a driving voltage line to supply a voltage to the driving TFT and extends from the second electrode.

8. A thin-film transistor (TFT) array substrate, comprising:
   a driving TFT and a switching TFT on a substrate;
   a storage capacitor including a first electrode connected to a driving gate electrode of the driving TFT and a second electrode on the first electrode and insulated from the first electrode;
   a first interlayer insulating film covering the first electrode and a switching gate electrode of the switching TFT; and
   a second interlayer insulating film on the first interlayer insulating film and including an opening exposing a part of the first interlayer insulating film, wherein the second electrode is in the opening of the second interlayer insulating film.

9. The substrate as claimed in claim 8, wherein a thickness of the second interlayer insulating film is greater than a thickness of the first interlayer insulating film.

10. The substrate as claimed in claim 8, wherein:
    the first interlayer insulating film includes an inorganic material, and
    the second interlayer insulating film includes an organic material.

11. The substrate as claimed in claim 8, wherein the driving TFT and the storage capacitor at least partially overlap each other.

12. The substrate as claimed in claim 8, further comprising:
    a first wire on a same layer as the driving gate electrode; and
    a second wire on the second interlayer insulating film and at least partially overlapping the first wire.

13. The substrate as claimed in claim 8, further comprising:
    a contact metal on the second interlayer insulating film and connected to the switching TFT.

14. The substrate as claimed in claim 8, further comprising:
    a pad region including at least one pad connected to a driver integrated circuit for driving the driving TFT and the switching TFT; and
    a sealing region including a sealing material between the pad region and the driving TFT, wherein the sealing region excludes the second interlayer insulating film.

15. An organic light-emitting display apparatus, comprising:
    a display area including a plurality of pixels; and
    a non-display area around the display area,
    wherein each of the plurality of pixels includes:
    a driving thin-film transistor (TFT) on a substrate;
    a storage capacitor including a first electrode connected to a driving gate electrode of the driving TFT and a second electrode on the first electrode and insulated from the first electrode;
    a first wire on a same layer as the driving gate electrode;
    a first interlayer insulating film covering the first electrode and the first wire;
    a second interlayer insulating film on the first interlayer insulating film and including an opening exposing part of the first interlayer insulating film; and
    a second wire on the second interlayer insulating film and at least partially overlapping the first wire, wherein the second electrode is in the opening of the second interlayer insulating film and wherein the driving gate electrode and the first electrode are integrally formed as one body on a same layer.

16. The display apparatus as claimed in claim 15, wherein a thickness of the second interlayer insulating film is greater than a thickness of the first interlayer insulating film.

17. The display apparatus as claimed in claim 15, wherein:
- the first interlayer insulating film includes an inorganic material, and
- the second interlayer insulating film includes an organic material.

18. The display apparatus as claimed in claim 15, further comprising:
- a sealing substrate facing the substrate; and
- a sealing material adhering the substrate and the sealing substrate, the sealing material surrounding the display area, wherein the sealing material directly contacts the first interlayer insulating film.

19. The display apparatus as claimed in claim 18, further comprising:
- an organic light-emitting diode in the display area and including a pixel electrode, an intermediate layer including an organic emission layer, and a counter electrode; and
- a spacer that maintains a substantially uniform interval between the substrate and the sealing substrate.

20. The display apparatus as claimed in claim 15, further comprising:
- a pad region in the non-display area and including at least one pad connected to a driver integrated circuit for driving the pixels.

21. The display apparatus as claimed in claim 15, wherein:
- each of the pixels includes a switching transistor, and
- the first interlayer insulating film and the second interlayer insulating film are stacked on a gate electrode of the switching transistor.

* * * * *